(12) United States Patent
Ponoth et al.

(10) Patent No.: US 8,704,343 B2
(45) Date of Patent: Apr. 22, 2014

(54) BORDERLESS INTERCONNECT LINE STRUCTURE SELF-ALIGNED TO UPPER AND LOWER LEVEL CONTACT VIAS

(75) Inventors: Shom Ponoth, Clifton Park, NY (US); David V. Horak, Essex Junction, VT (US); Charles W. Koburger, III, Delmar, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/607,677

(22) Filed: Sep. 8, 2012

(65) Prior Publication Data

US 2012/0329275 A1  Dec. 27, 2012

Related U.S. Application Data

(62) Division of application No. 12/899,911, filed on Oct. 7, 2010, now Pat. No. 8,299,625.

(51) Int. Cl.
*H01L 21/44* (2006.01)

(52) U.S. Cl.
USPC ........... 257/666; 438/637; 438/639; 438/669; 257/E21.59

(58) Field of Classification Search
USPC .......... 438/631, 638, 639, 640; 257/E21.577, 257/E21.578, E21.585, E21.588
See application file for complete search history.

(56) References Cited

U.S. PATENT DOCUMENTS

| | | | |
|---|---|---|---|
| 4,944,682 A | 7/1990 | Cronin et al. | |
| 5,350,484 A | 9/1994 | Gardner et al. | |
| 5,596,230 A | 1/1997 | Hong | |
| 5,888,897 A | 3/1999 | Liang | |
| 6,040,619 A | 3/2000 | Wang et al. | |
| 6,083,824 A | 7/2000 | Tsai et al. | |
| 6,258,709 B1 | 7/2001 | McDaniel | |
| 6,284,642 B1 | 9/2001 | Liu et al. | |
| 6,577,007 B1 | 6/2003 | Mehta | |
| 6,713,831 B1 | 3/2004 | Sadoughi et al. | |
| 7,119,010 B2 | 10/2006 | Lim et al. | |
| 7,233,063 B2 | 6/2007 | Furukawa et al. | |
| 7,514,365 B2 * | 4/2009 | Cheng et al. | 438/700 |
| 7,696,085 B2 | 4/2010 | Li et al. | |
| 2002/0155693 A1 | 10/2002 | Hong et al. | |
| 2002/0192944 A1 * | 12/2002 | Sonderman et al. | 438/637 |
| 2010/0052178 A1 | 3/2010 | Meinhold et al. | |

OTHER PUBLICATIONS

Moussavi, M., "Advanced Conventional Interconnects: State of the Art, Future Trends, and Limitations" Springer Series in Optical Sciences (2006) pp. 1-13, vol. 1(19).

* cited by examiner

*Primary Examiner* — Jasmine Clark
(74) *Attorney, Agent, or Firm* — Scully, Scott, Murphy & Presser, P.C.; Parashos Kalaitzis, Esq.

(57) ABSTRACT

A metal layer is deposited on a planar surface on which top surfaces of underlying metal vias are exposed. The metal layer is patterned to form at least one metal block, which has a horizontal cross-sectional area of a metal line to be formed and at least one overlying metal via to be formed. Each upper portion of underlying metal vias is recessed outside of the area of a metal block located directly above. The upper portion of the at least one metal block is lithographically patterned to form an integrated line and via structure including a metal line having a substantially constant width and at least one overlying metal via having the same substantially constant width and borderlessly aligned to the metal line. An overlying-level dielectric material layer is deposited and planarized so that top surface(s) of the at least one overlying metal via is/are exposed.

9 Claims, 11 Drawing Sheets

BORDERLESS INTERCONNECT LINE STRUCTURE SELF-ALIGNED TO UPPER AND LOWER LEVEL CONTACT VIAS

CROSS REFERENCE TO RELATED APPLICATION

This application is a divisional of U.S. patent application Ser. No. 12/899,911, filed Oct. 7, 2010, now U.S. Pat. No. 8,299,625, issued on Oct. 30, 2012, the entire content and disclosure of which is incorporated herein by reference.

BACKGROUND

The present disclosure relates to a metal interconnect structure, and particularly to a metal interconnect structure including a borderless interconnect line structure that is self-aligned to upper and lower metal contact vias, and methods of manufacturing the same.

Lithographic capabilities are one of the significant technological limitations that constrain the continued scaling of semiconductor devices. Lithographic capabilities limit the scaling in two ways. First, the feature size that can be lithographically defined in a single lithographic exposure and development is limited to a minimum dimension that a lithography tool can print, which is typically called a critical dimension. Even with the most advanced lithography tools, the critical dimension achievable as of 2010 is about 30 nm. In other words, dimensions less than 30 nm cannot be printed through conventional lithography techniques.

Second, overlay variations inherent in any alignment process that lithographically defines a new pattern in spatial registry with an existing pattern causes misalignment between existing elements and newly formed elements. The effect of such overly variations can be illustrated with a prior art metal interconnect structure such as the structure shown in FIG. 1 and formed by conventional methods. Mx level metal lines and V(x−1) level metal vias can be formed in a dielectric material layer by employing a first lithographic exposure that defines the location of the V(x−1) level metal vias and a second lithographic exposure that defines the location of the Mx level metal lines followed by appropriate etch processing steps, a metal deposition step, and a planarization step. The ideal interline spacings between an adjacent pair of Mx level metal lines can be effectively reduced by a finite overly variation between the V(x−1) level metal vias and the Mx level metal lines. Specifically, if a lateral protrusion of a V(x−1) level metal via is $\delta 1$, the effective spacing between a metal line including a V(x−1) level metal via and an adjacent metal line can be s−$\delta 1$. Likewise, the ideal interline spacing s between an adjacent pair of Mx level metal lines can also be effectively reduced by a finite overly variation between Vx level metal vias and the Mx level metal lines. Specifically, if a lateral protrusion of a Vx level metal via is $\delta 2$, the effective spacing between a metal line including a Vx level metal via and an adjacent metal line can be s−$\delta 2$.

Such misalignments between a metal line and a metal via in the level directly below the metal line and between the metal line and a metal via in the level directly above the metal line can cause direct electrical short, or can cause a reliability failure through time dependent dielectric breakdown (TDDB). In a TDDB failure, the electrical isolation of a dielectric material portion between two conductive elements deteriorates in time due to at least one mechanism such as electromigration, impurity penetration, or material degradation so that a conductive path is formed between the two conductive elements in time. In order to prevent outright electrical shorts and TDDB failures, therefore, it is necessary to maximize the effective lateral spacing between adjacent metal lines while allowing sufficient electrical contact between the metal lines and the contact vias located above and below.

SUMMARY

A borderless metal contact structure is provided that has a maximum effective lateral spacing between adjacent metal lines, while providing electrical contact to contact vias located above and below the metal lines. A metal layer is deposited on a planar surface on which top surfaces of underlying metal vias are exposed. The metal layer is patterned to form at least one metal block, which has a horizontal cross-sectional area of a metal line to be formed and at least one overlying metal via to be formed. Each upper portion of underlying metal vias is recessed outside of the area of a metal block located directly above, so that each upper portion of the underlying metal vias has the same width as the metal block located directly above. Thus, the sidewalls of at least one underlying metal via are borderlesly aligned to sidewalls of the metal block. The upper portion of the at least one metal block is lithographically patterned to form an integrated line and via structure including a metal line having a substantially constant width and at least one overlying metal via having the same substantially constant width and borderlessly aligned to the metal line. An overlying-level dielectric material layer is deposited and planarized so that top surface(s) of the at least one overlying metal via is/are exposed, on which additional metal interconnect structures and/or contact pads can be formed.

According to an aspect of the present disclosure, a structure includes: an integrated line and via structure of integral construction embedded in an upper portion of a dielectric material layer, the integrated line and via structure including a metal line having a substantially constant width and at least one overlying metal via having the substantially constant width, and sidewalls of the at least one overlying metal via are vertically coincident with sidewalls of the metal line; and an underlying metal via including an upper underlying metal via portion and a lower underlying metal via portion, wherein the upper underlying metal via portion has a pair of sidewalls laterally spaced by the substantially constant width and embedded in a lower portion of the dielectric material layer.

According to another aspect of the present disclosure, a method of forming a structure includes: forming an underlying metal via embedded in an underlying dielectric material layer on a substrate; depositing a metal layer on a top surface of the underlying dielectric material layer; patterning the metal layer to form a metal block having a facing pair of sidewalls; and etching an upper portion of the underlying metal via within an area that does not underlie the metal block.

DETAILED DESCRIPTION

Figure 1:
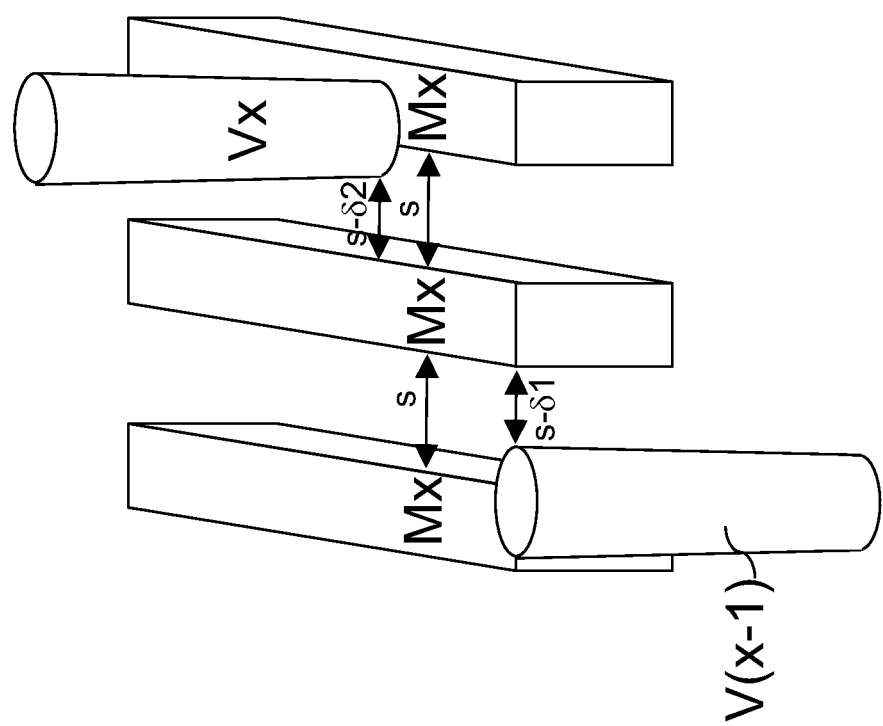
FIG. 1 is a schematic view of a prior art metal interconnect structure that illustrates reduction of effective spacing between adjacent metal lines.

As stated above, the present disclosure relates to a metal interconnect structure including a borderless interconnect line structure that is self-aligned to upper and lower metal contact vias, and methods of manufacturing the same, which are now described in detail with accompanying figures. It is noted that like and corresponding elements are referred to by like reference numerals. The drawings are not in scale. Some elements in the see-through views in the drawings are represented by dotted lines or omitted for clarity.

Figure 2:
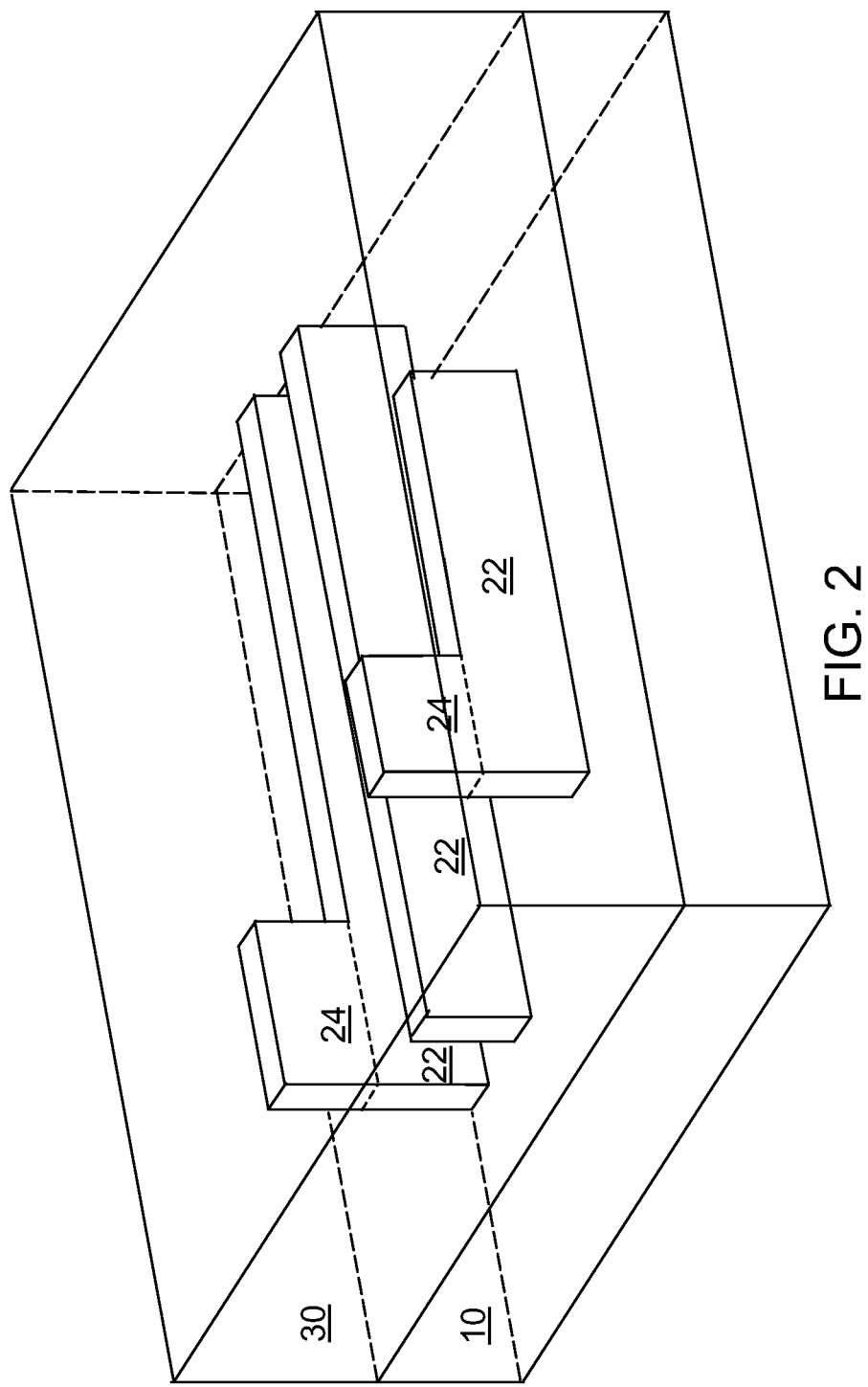
FIG. 2 is a see-through bird's eye view of an exemplary structure including at least underlying metal vias embedded in an underlying dielectric material layer according to an embodiment of the present disclosure.

Referring to FIG. 2, an exemplary structure according to an embodiment of the present disclosure includes a substrate 10 and an underlying dielectric material layer 30 located on a surface of a substrate 10. As shown, various underlying metal interconnect structures are embedded in the underlying dielectric material layer 30. The underlying dielectric material layer 30 is herein referred to as an "underlying" dielectric material layer because additional dielectric material layers are subsequently formed thereupon. Specifically, the substrate 10 can include a semiconductor substrate (not separately shown) including at least one semiconductor device (not separately shown). The semiconductor substrate includes a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material includes silicon. The substrate 10 can include a bulk semiconductor substrate or a semiconductor-on-insulator (SOI) substrate. The at least one semiconductor device can be a field effect transistor, a bipolar transistor, a diode, a resistor, a capacitor, an inductor, an electrically programmable fuse, or any combination thereof. Optionally, the substrate 10 may further include at least one dielectric material layer (not shown separately) and metal interconnect structures (not shown separately) embedded therein such as metal lines and/metal vias.

The underlying dielectric material layer 30 includes a dielectric material, which can be a conventional dielectric material such as undoped silicon oxide (undoped silicate glass), doped silicon oxide (doped silicate glass), silicon oxynitride, silicon nitride, or a combination thereof, or can be a low dielectric constant (low-k) material, which refers to a dielectric material having a dielectric constant less than the dielectric constant of silicon oxide, i.e., 3.9. Low dielectric constant materials that can be employed for the underlying dielectric material layer 30 include organosilicate glass including Si, C, O, H, and optionally N, and methylated-hydrogen silsesquioxane (MSQ). The low dielectric constant material can be deposited by chemical vapor deposition or by spin-coating, and can be porous or non-porous. The underlying dielectric material layer 30 is formed at an interconnect level, i.e., at a level in which metal interconnect structures are present. This interconnect level is herein referred to as an "underlying" interconnect level because another interconnect level is constructed above this level. The thickness of the underlying dielectric material layer 30 can be from 30 nm to 600 nm, and typically from 60 nm to 300 nm, although lesser and greater thicknesses can also be employed.

The underlying metal interconnect structures include at least one underlying metal via 24, which is located at places at which a vertical electrical connection is desired between the underlying metal interconnect structures and metal interconnect structures to be subsequently formed. The at least one underlying metal via 24 may be constructed as a discrete element that is not integrally constructed with an underlying metal line, or may be constructed as a part of an underlying metal interconnect structure of integral construction, i.e., a single contiguous piece, that includes an underlying metal line directly contacting and located below the at least one underlying metal via 24. While the present disclosure is illustrated with drawings in which some underlying metal interconnect structures are a structure of integral construction including at least one underlying metal via 24 and an underlying meta line 22, embodiments can also be employed in which the at least one underlying metal via 24 is a discrete element that is not integrally constructed with any underlying metal line.

Each underlying metal interconnect structure (24, 22) can be structures confined within a pair of facing substantially vertical planes with which sidewalls of the underlying metal interconnect structure (24, 22) coincide. A plane or a sidewall is "substantially vertical" if the deviation of the plane or the sidewall from a vertical plane or a vertical sidewall is limited only by a deviation introduced into the plane or the sidewall during an etch process that forms the plane or the sidewall. In some embodiments, it is possible to eliminate this deviation by employing an etch process that forms a vertical plane or a vertical sidewall. In one embodiment, the angular deviation of a substantially vertical plane or a substantially vertical sidewall from a vertical plane can be less than 10 degrees, and preferably less than 6 degrees. Such an underlying metal interconnect structure (24, 22) can be formed by employing subtractive etch processes in which a hard mask that defines rectangular openings. Within the hard mask, an underlying metal line 22 is subsequently formed in the underlying dielectric material layer 30 in the lengthwise direction of a rectangular opening such that the width of the underlying metal line 22 is limited by the width of the rectangular opening. Further, the rectangular opening is also employed to limit the width of metal vias 24 in the underlying dielectric material layer 30. Thus, the pair of substantially vertical planes passing through the lengthwise edges of a rectangular opening in the hardmask can be the pair of facing substantially vertical planes with which sidewalls of the underlying metal interconnect structure (24, 22) coincide. The topmost surfaces of the underlying metal interconnect structures (24, 22) are coplanar with the top surface of the underlying dielectric material layer 30. The underlying metal interconnect structures (24, 22) are electrically connected to the at least one semiconductor device in the substrate 10.

Alternately, the underlying metal interconnect structures can be formed by conventional lithographic patterning and etch that defines at least one underlying metal via 24. In this case, the underlying metal interconnect structures are discrete metal vias (not shown) that is not integrally constructed with any underlying metal line. The discrete metal vias can have conventional shapes such as a circular cylinder, an elliptic cylinder, or a rectangular parallelepiped. A rectangular parallelepiped is a polyhedron in which all faces are rectangles. In this case, the topmost surfaces of the underlying metal interconnect structures, i.e., the discrete metal vias, are coplanar with the top surface of the underlying dielectric material layer 30. The discrete metal vias are electrically connected to the at least one semiconductor device in the substrate 10.

Figure 3:
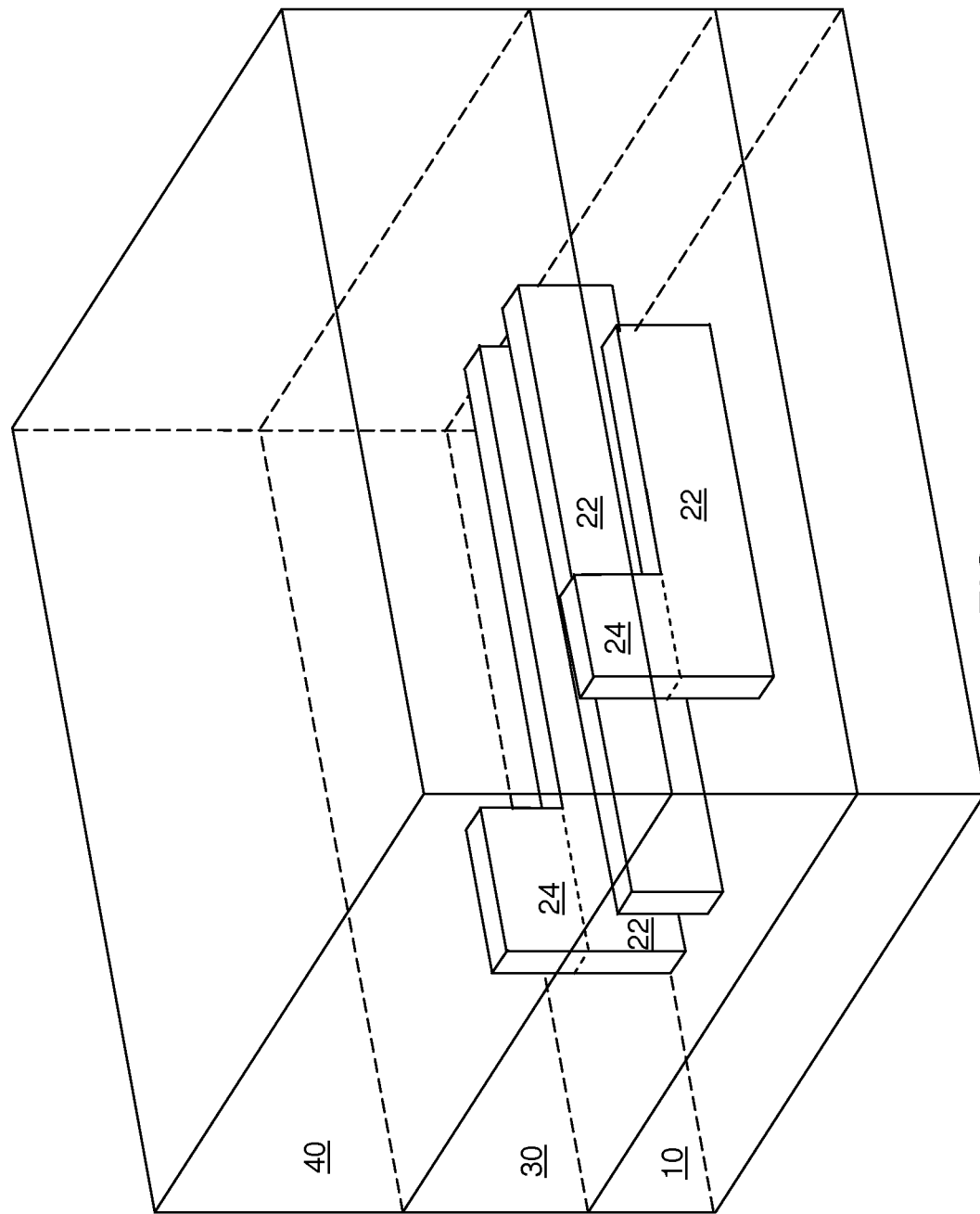
FIG. 3 is a see-through bird's eye view of the exemplary structure of FIG. 2 after deposition of a metal layer according to an embodiment of the present disclosure.

Referring to FIG. 3, a metal layer 40 is deposited on the top surface of the underlying dielectric material layer 30 and the exposed top surfaces of the underlying metal interconnect structures (24, 22). The metal layer 40 includes a metal that can be etched and provides electrical conductivity greater than $1.0 \times 10^7$ S/m, and preferably electrical conductivity greater than $3.0 \times 10^7$ S/m. Metals having electrical conductivity greater than $1.0 \times 10^7$ S/m include Ag, Cu, Au, Al, Co, Ni, Zn, Mo, Ru, Rh, W, Os, and Ir. Metals having lesser electrical conductivity than $1.0 \times 10^7$ S/m may be used provided that patterning the metal can be achieved with ease. Metals having electrical conductivity greater than $3.0 \times 10^7$ S/m include Ag, Cu, Au, and Al. In one embodiment, the metal layer 40 includes an elemental metal or a metallic compound in which a single elemental metal has an atomic percentage greater than 98%. Alternately or in addition, all of a predominant portion of the metal layer 40 can include an elemental metal selected from Cu, Al, and W, which provide good electrical conductivity and ease of patterning employing well known methods in the art.

The metal layer 40 is deposited as a blanket layer having the same thickness throughout. The metal layer 40 can be deposited, for example, by physical vapor deposition, chemical vapor deposition, electroplating, electroless plating, vacuum evaporation, or a combination thereof. The thickness of the metal layer 40 can be from 50 nm to 1,000 nm, and typically from 100 nm to 500 nm, although lesser and greater thicknesses can also be employed.

Figure 4:
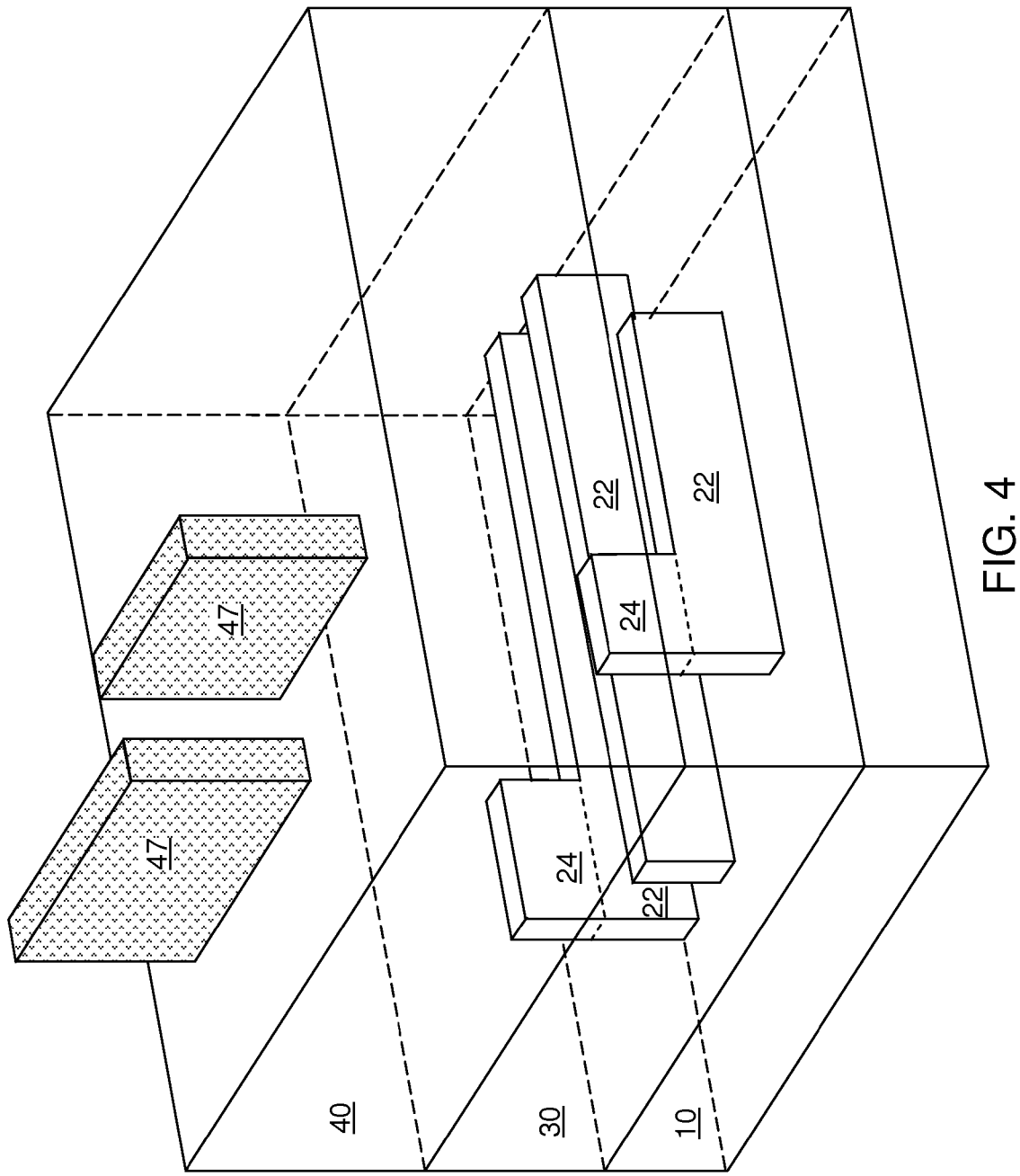
FIG. 4 is a see-through bird's eye view of the exemplary structure of FIG. 3 after applying a first photoresist and lithographically patterning the first photoresist according to an embodiment of the present disclosure.

Referring to FIG. 4, a first photoresist 47 is applied to the top surface of the metal layer 40 and is lithographically patterned to define areas in which metal interconnect structures are to be formed out of the metal layer 40. Specifically, the areas in which the first photoresist 47 remains after the lithographic patterning are the areas in which metal lines are to be subsequently formed by a remaining portion of the metal layer 40. The first photoresist 47 as lithographically patterned can include at least one facing pair of sidewalls that are laterally spaced by a first substantially constant width. A width between a pair of elements is "substantially constant" if the variation of the width is limited only by a taper introduced into the pair of elements during an etch process that forms the pair of elements. In some embodiments, it is possible to eliminate the taper in the at least one facing pair of sidewalls by employing an etch process in which the taper angle is zero. In one embodiment, each pair in the at least one facing pair of sidewalls can have a substantially constant width having a variation less than 20% of an average width throughout the entirety of the surfaces of the pair of sidewalls. The first photoresist 47 can include at least one anti-reflective coating (ARC) layer (not shown separately). The planes of the at least one facing pair of sidewalls can be perpendicular to the lengthwise direction of the underlying metal interconnect structures (24, 22) in the underlying dielectric material layer 30.

Figure 5:
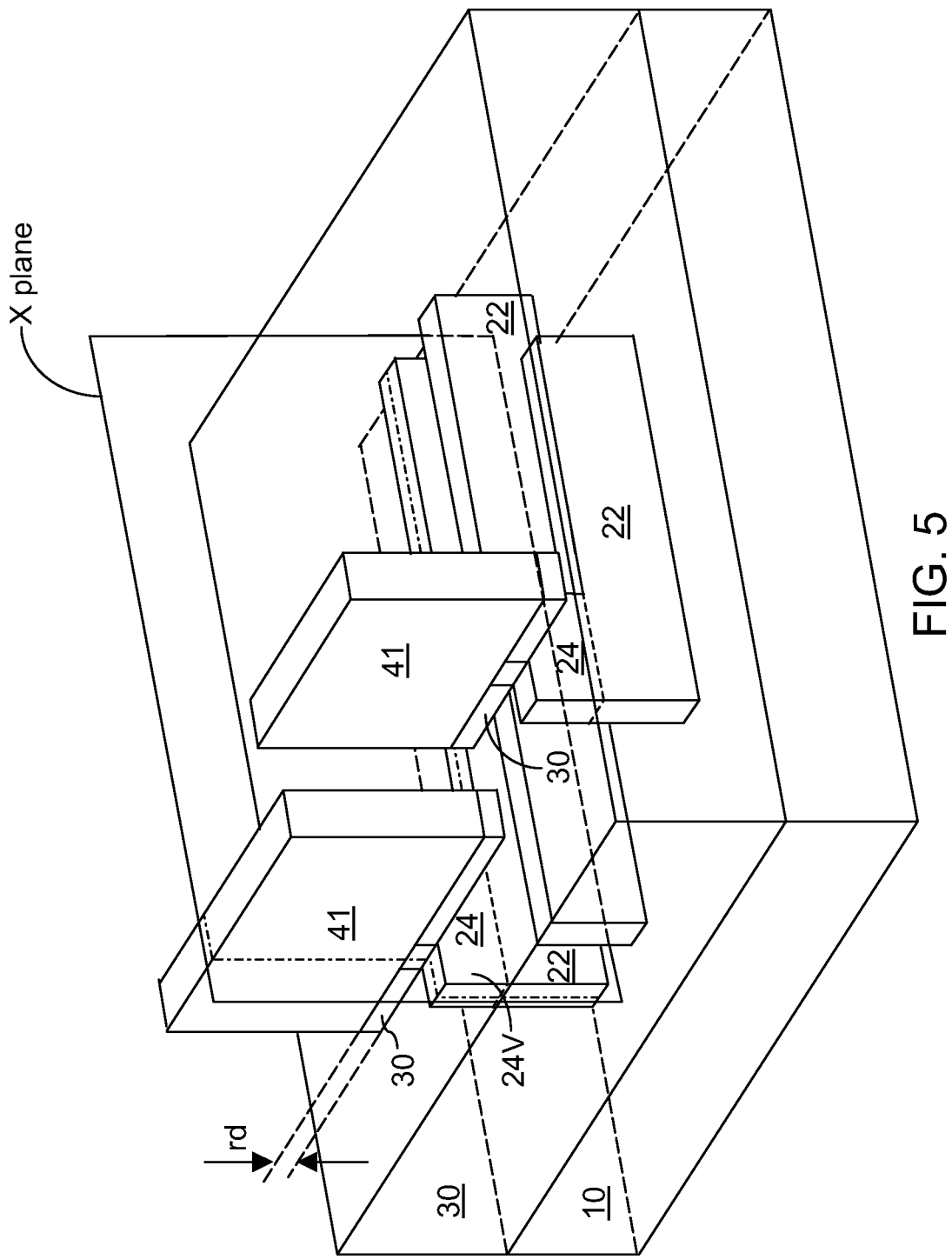
FIG. 5 is a see-through bird's eye view of the exemplary structure of FIG. 4 after forming metal blocks by transferring the pattern in the first photoresist into the metal layer according to an embodiment of the present disclosure.
Figure 5A:
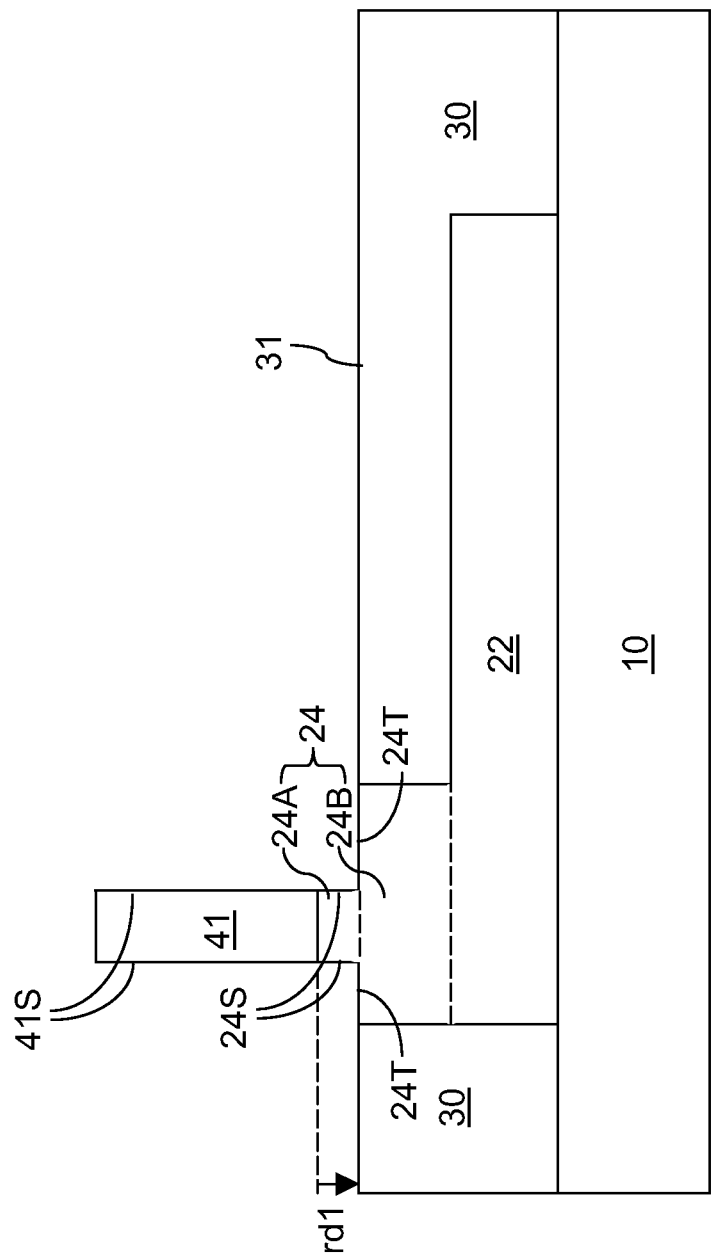
FIG. 5A is a vertical cross-sectional vie of the exemplary structure shown in FIG. 5 along a vertical plane labeled as an "X-plane" in FIG. 5.

Referring to FIGS. 5 and 5A, the pattern in the first photoresist 47 is transferred through the metal layer 40 and into an upper portion of the underlying dielectric material layer 30 by an anisotropic etch that removes exposed portions of the metal layer 40, the underlying dielectric material layer 30, and the underlying metal interconnect structures (24, 22) employing the first photoresist 47 as an etch mask. At least one remaining portion of the metal layer 40 forms at least one metal block 41 having a shaped of a rectangular parallelepiped. Each metal block 41 can have the same horizontal cross-sectional area as an overlying portion of the first photoresist 47, or can have a uniform lateral offset relative to the overlying portion of the first photoresist 47 depending on whether a shrink or a trim is used on the photoresist 47 (See FIG. 4). The height of each of the at least one metal block 41 can be the same as the thickness of the metal layer 40. Each of the at least one metal block 41 can include a facing pair of sidewalls, which is herein referred to as first facing sidewalls 41S that can be laterally spaced from each other by the first substantially constant width, or can have a gradually varying width determined by any taper, i.e., deviation from a vertical surface, in the first facing sidewalls 41S introduced during an etch process that forms the first facing sidewalls 41S.

The anisotropic etch also removes the upper portions of the underlying dielectric material layer 30 and the underlying metal interconnect structures (24, 22) that are not covered by the first photoresist 47. A top surface of the underlying dielectric material layer 30 is recessed below the horizontal interface between a bottom surface of the at least one metal blocks 41 and at least one topmost surface of the underlying dielectric material layer 30 by a recess distance rd. The recess distance rd can be from 1% to 80%, and typically from 10% to 30%, of the height of the at least one underlying metal via 24. The at least one topmost surface of the underlying dielectric material layer 30 contacts, and directly underlies, the at least one metal block 41. The area of the at least one topmost surface of the underlying dielectric material layer 30 coincide with the area of the bottom surface(s) of the at least one metal block 41. A first recessed top surface 33 of the underlying dielectric material layer 30 is vertically offset from the topmost surface(s) of the underlying dielectric material layer 30 by the first recess depth rd1. The first photoresist 47 is removed after the anisotropic etch is complete, i.e., after the first recessed top surface 33 of the underlying dielectric material layer 30 is recessed by the first recess depth rd1 below the bottom surface of the at least one metal block 41.

The anisotropic etch removes portions of the underlying metal interconnect structures (24, 22) that are not covered by the at least one metal block 41 and located above the first recessed top surface 33 of the underlying dielectric material layer 30. Each remaining portion of the upper portion of the at least one underlying metal via 24 after the etching forms an upper underlying metal via portion 24A having a shape that is defined by a Boolean "AND" of the horizontal cross-sectional shape(s) of the at least one metal block 41 and the original horizontal cross-sectional shape of the at least one underlying metal via 24.

Each upper underlying metal via portion 24A has a facing pair of sidewalls. This facing pair of sidewalls is herein referred to as second facing sidewalls 24S. The second facing sidewalls 24S can be laterally spaced by the first substantially constant width, i.e., the lateral distance between the first facing sidewalls 41S, or can have a gradually varying width determined by any taper in the second facing sidewalls 24S introduced during an etch process that forms the second facing sidewalls 24S. The first facing sidewalls 41S and the second facing sidewalls 24S are "borderlessly" connected to each other, i.e., connected to each other and located within same planes so that edges of the first facing sidewalls 41S coincide with edges of the second facing sidewalls 24S. The first facing sidewalls 41S and the second facing sidewalls 24S are substantially vertical within the degree of taper present therein. Consequently, the first facing sidewalls 41S and the second facing sidewalls 24S are substantially perpendicular, within the degree of taper present therein, to the X-plane in FIG. 5, which is the plane of the drawing of FIG. 5A.

An upper underlying metal via portion 24A is a portion of an underlying metal via portion 24 that is located above the first recessed top surface 33 of the underlying dielectric material layer 30. The portion of the underlying metal via portion 24 located underneath the first recessed top surface 33 of the underlying dielectric material layer 30 is a lower underlying metal via portion 24B. An upper underlying metal via portion 24A and a lower underlying metal via portion 24B located directly underneath collectively constitute an underlying metal via 24. Each underlying metal via 24 is laterally confined by a facing pair of sidewalls. This pair of sidewalls is herein referred to as third facing sidewalls 24V. The third facing sidewalls 24V can be substantially parallel, within the degree of tapers that may be present in the third facing sidewalls 24V, to the X-plane in FIG. 5, which is the plane of the drawing of FIG. 5A. Correspondingly, the third facing sidewalls 24V can be substantially perpendicular to the first facing sidewalls 41S and the second facing sidewalls 24S within the degree of tapers that may be present in the third facing sidewalls 24V, the first facing sidewalls 41S, and the second facing sidewalls 24S. Each of the third facing sidewalls 24V can extend throughout the upper underlying metal via portion 24A and the lower underlying metal via portion 24B, can be separated by a second substantially constant width, and can adjoin substantially vertical edges of the second facing sidewalls 24S, which are a pair of sidewalls of the upper underlying metal via portion 24S. The second substantially constant width is the lateral dimension of the at least one underlying metal via 24 and an underlying metal line 22 that is integrally constructed with the at least one underlying metal via 24.

A top surface 24T of a lower underlying metal via portion 24B of an underlying metal via 24 is recessed during the anisotropic etching of the upper portion of the underlying metal via 24. The top surface 24T is a horizontal surface adjoins a bottom edge of one of the second facing sidewalls 24S, which are a pair of sidewalls of the upper underlying metal via portion 24A located directly on the lower underlying metal via portion 24B. The lower underlying metal via portion 24B is embedded in the underlying dielectric material layer 30.

In one embodiment, the etch rate of the material of the at least one underlying metal via 24 is substantially the same as the etch rate of the material of the underlying dielectric material layer 30 during the anisotropic etch, and the first recessed top surface 33 of the underlying dielectric material layer 30 is coplanar with the top surface 24T of the lower underlying metal via portion 24B. In another embodiment, the etch rate of the material of the at least one underlying metal via 24 can be different from the etch rate of the material of the underlying dielectric material layer 30 during the anisotropic etch, and the first recessed top surface 33 of the underlying dielectric material layer 30 can be vertically offset from the top surface 24T of the lower underlying metal via portion 24B either upward or downward.

At least one portion of the underlying dielectric material layer 30 is present between the bottom surface of each metal block 41 and a horizontal plane of the first recessed top surface 33 of the underlying dielectric material layer 30. The area of the at least one portion the underlying dielectric material layer 30 is the area of an overlying metal block 41 located directly above less the area of all upper underlying metal via portions 24A underneath the overlying metal block 41. The height of the at least one portion of the underlying dielectric material layer 30 is the same as the first recess depth rd1.

Figure 6:
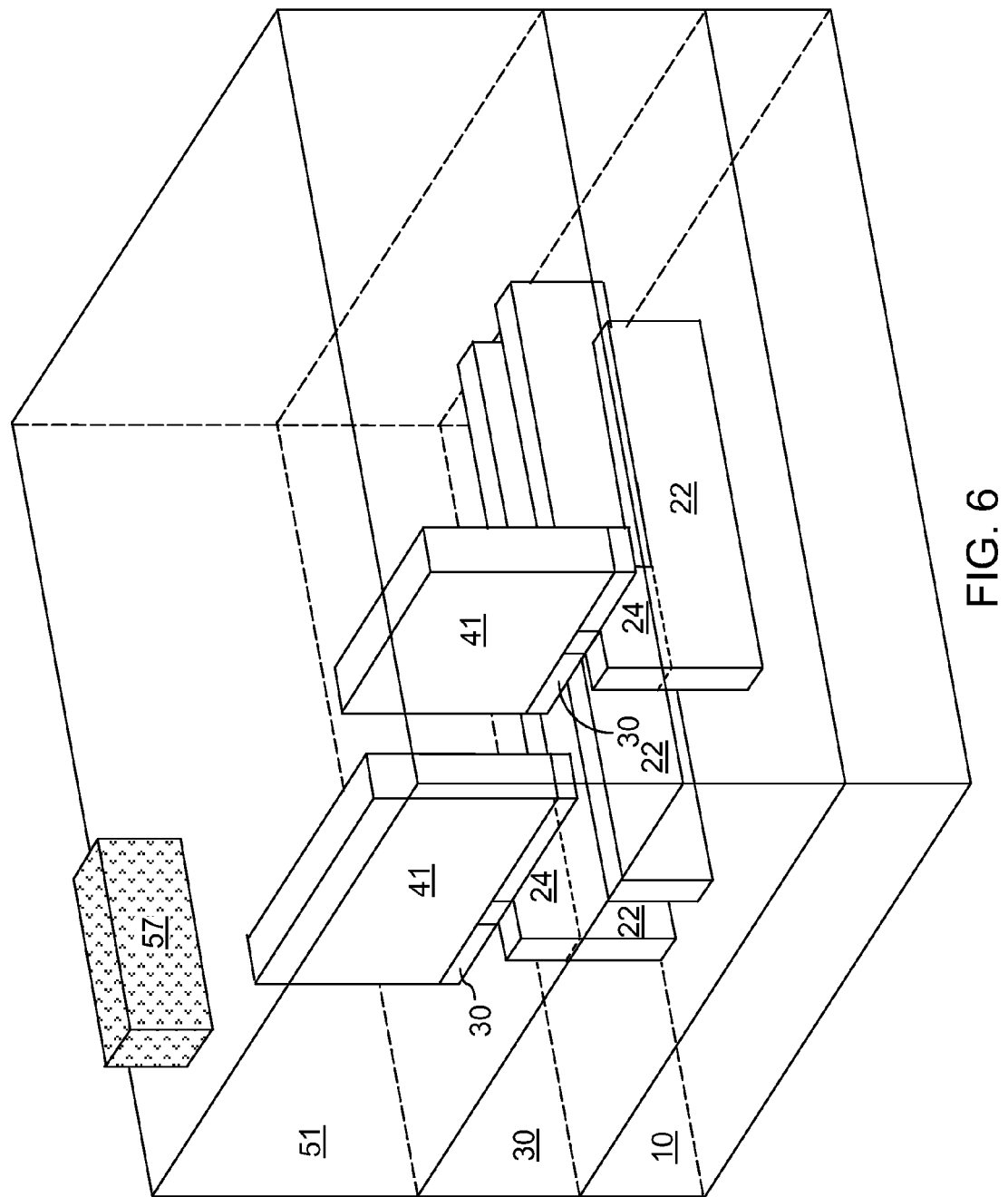
FIG. 6 is a see-through bird's eye view of the exemplary structure of FIG. 5 after formation of a disposable patterning layer and application and patterning of a second photoresist according to an embodiment of the present disclosure.

Referring to FIG. 6, a disposable patterning layer 51 is formed over the underlying dielectric material layer 30 and the at least one metal block 41. In one embodiment, the disposable patterning layer 51 is an optically planarizing layer (OPL) including a self-planarizing material. The self-planarizing material of the OPL can be an organic material including C, O, and H, and optionally including Si and/or F. The formulation of the OPL can be selected to provide low viscosity so that a top surface of the OPL is self-planarizing over underlying topographic features. The thickness of the disposable patterning layer 51 can be selected to be greater than the height of the at least one metal block 41 so that the at least one metal block 41 is completely covered by the disposable patterning layer 51.

A second photoresist 57 is applied to the top surface of the disposable patterning layer 51 and is lithographically patterned to define areas in which metal interconnect structures are to be formed out of the metal layer 40. Specifically, the areas in which the second photoresist 57 remains after the lithographic patterning include the areas in which metal vias are to be subsequently formed by a remaining portion of the at least one metal block 41. The second photoresist 57 as lithographically patterned can be located within at least one rectangular area, of which the lengthwise direction is perpendicular to the first facing sidewalls 41S (See FIG. 5) separated by the first substantially constant width. The second photoresist 57 can include at least one anti-reflective coating (ARC) layer (not shown separately).

Figure 7:
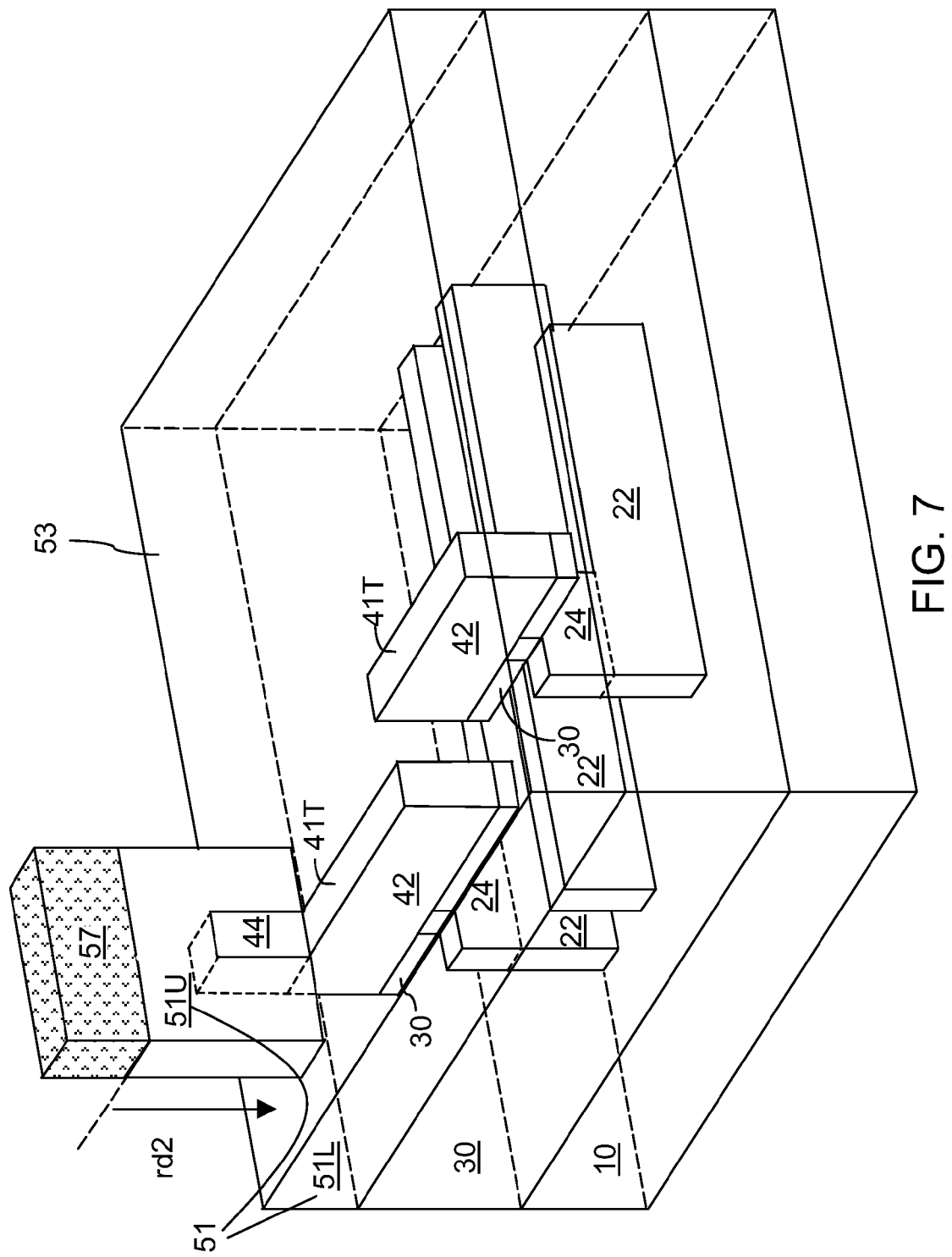
FIG. 7 is a see-through bird's eye view of the exemplary structure of FIG. 6 after transfer of the pattern in the second photoresist into an upper portion of the disposable patterning layer and formation of at least one integrated line and metal via structure including a metal line having a substantially constant width and at least one overlying metal via having the same substantially constant width according to an embodiment of the present disclosure.

Referring to FIG. 7, the pattern in the second photoresist 57 is transferred by an anisotropic etch into an upper portion of the disposable patterning layer 51. A second recessed top surface 53 of the disposable patterning layer 51 is vertically recessed below the bottom surface of the second photoresist 57 by a second recess depth rd2. The remaining portions of the disposable patterning layer 51 include a lower disposable patterning material portion 51L located below the second recessed top surface 53 and at least one upper disposable patterning material portion 51U located above the second recessed top surface 53.

Within each metal block 41 (See FIG. 6), an upper portion of the at least one metal block 41 (See FIG. 6) is also removed by the anisotropic etch above the second recessed top surface 53 of the disposable patterning layer 51. A planar top surface 41T of the metal block 41 is vertically recessed relative to the bottom surface of the second photoresist 57. Depending on the relative etch rates of the material of the metal block 41 and the material of the disposable patterning layer, the vertical recess distance of the planar top surface 41T of the metal block 41 can be the same as, or different from, the second recess depth rd2. Correspondingly, the planar top surface 41T can be located above, below, or at the same level as the second recessed top surface 53 of the disposable patterning layer 51. Each remaining portion of the metal block 41 located above the horizontal plane including the planar top surface 41T forms a metal via 44, and the remaining portion of the metal block 41 located below the horizontal plane including the planar top surface 41T forms a metal line 42. At least one metal via 44 and a metal line 42 that are integrally constructed, i.e., in a single contiguous piece, constitute an integrated metal interconnect structure (44, 42) having substantially vertical sidewalls within the planes of the first facing sidewalls 41S (See FIG. 5A) spaced from each other by the first substantially constant width. Thus, the horizontal cross-sectional area of each metal via 44 can be a first rectangle having the first substantially constant width, and the horizontal cross-sectional area of each metal line can be a second rectangle having the first substantially constant width. Further, the portions of the lengthwise edges of the second rectangle coincide with two sides of the first rectangle.

The horizontal cross-sectional area of the at least one metal via 44 is an intersection of the horizontal cross-sectional area of the second photoresist 57 as patterned and the horizontal cross-sectional area of the at least one metal block 41. The combined horizontal cross-sectional areas of the at least one upper disposable patterning material portion 51U and the at least one metal via 44 is equal to the horizontal cross-sectional area of the second photoresist 57 at any level between the bottom surface of the second photoresist 57 and the higher of the second recessed top surface 53 and the planar top surface 41T. The ratio of the vertical distance between the top surface(s) of the at least one metal via 44 and the planar top surface(s) 41T, which is/are the top surface(s) of the at least one metal line 42, can be from 10% to 90%, and typically from 30% to 70%, although lesser and greater percentages can also be employed.

The anisotropic etch employing the second photoresist 57 as an etch mask forms at least one integrated line and via structure (44, 42) of integral construction by removing an upper portion of the at least one metal block 41 (See FIG. 6) above the planar top surface(s) 41T. Each integrated line and via structure (44, 42), as a structure derived from a metal block 41, includes a metal line 42 having the first substantially constant width and at least one metal via 44 that overlies the metal line 42 and has the first substantially constant width. Because the first facing sidewalls 41S (See FIG. 5A) of an integrated line and via structure (44, 42) and the second facing sidewalls 24S (See FIG. 5A) of an upper underlying metal via portion 24A (See FIG. 5A) are located within the same pair of facing substantially vertical planes, an entirety of the integrated line and via structure (44, 42) and the upper underlying metal via portion 24A directly underneath are located within that pair of facing substantially vertical planes, i.e., the pair of facing substantially vertical planes including the sidewalls of the metal line 42 and the sidewalls of the at least one metal via 44 within that integrated line and via structure (44, 42). The entirety of the integrated line and via structure (44, 42) can be composed of the same conductive material, i.e., the material of the metal layer 40 (See FIG. 3). In addition, at least one metal line 42 can be formed without any overlying metal via thereupon. Such at least one metal line 42 can be formed is the second photoresist 57 does not cover any area of a metal block 41. In this case, a planar top surface 41T has the same area as the top surface of the metal block 41 prior to the anisotropic etch.

Figure 8:
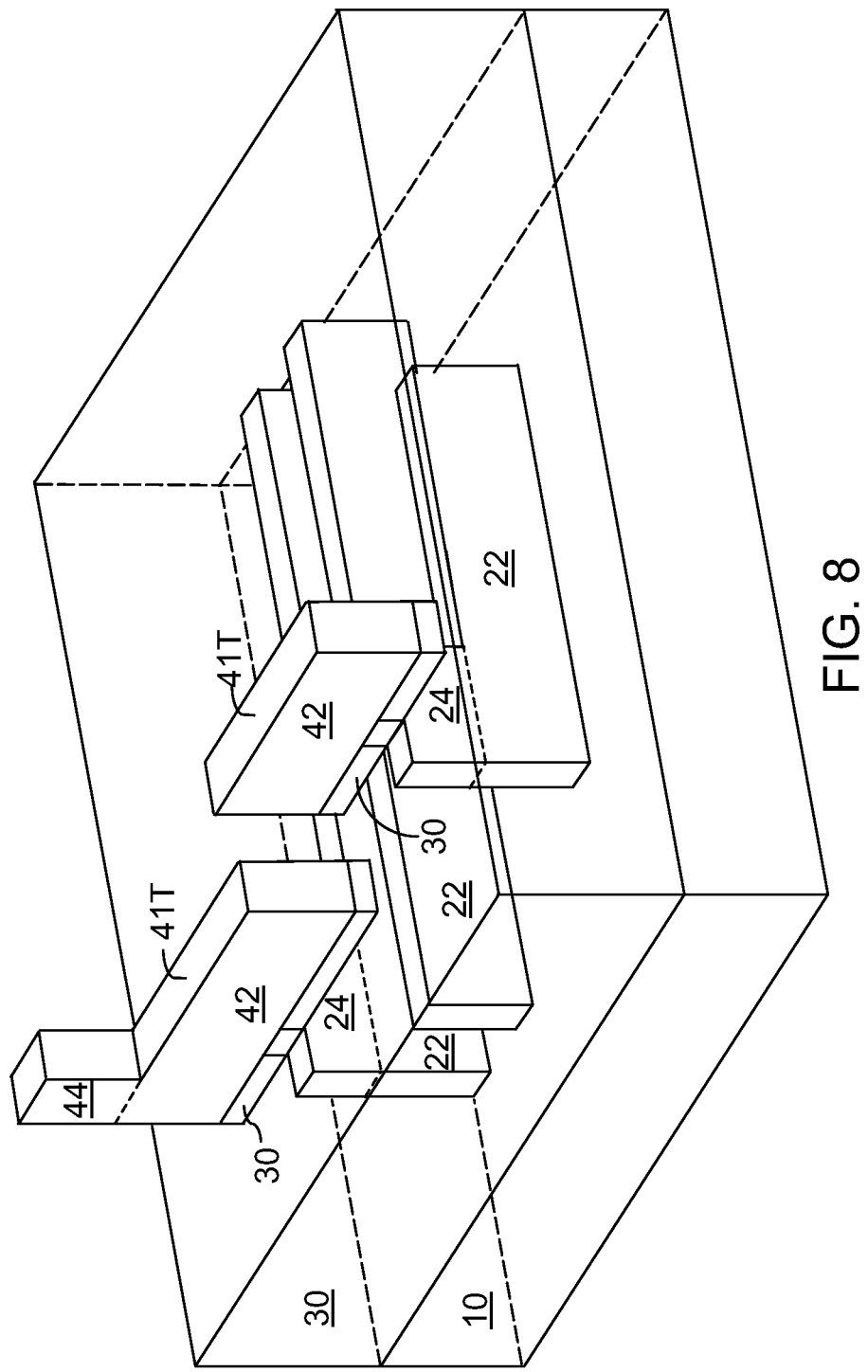
FIG. 8 is a see-through bird's eye view of the exemplary structure of FIG. 7 after removal of the disposable patterning layer according to an embodiment of the present disclosure.

Referring to FIG. 8, the second photoresist 57 is removed, for example, by ashing. The disposable patterning layer 51 is subsequently removed selective to the materials of the underlying dielectric material layer 30 and the at least one metal interconnect structure (44, 42). The removal of the disposable patterning layer 51 can be performed by a wet etch having selectivity to the materials of the underlying dielectric material layer 30 and the at least one metal interconnect structure (44, 42). For example, if the disposable patterning layer 51 is an OPL layer and the underlying dielectric material layer 30 includes a low-k dielectric material known in the art, wet etchants for an OPL as known in the art can be employed to remove the disposable patterning layer 51.

Figure 9:
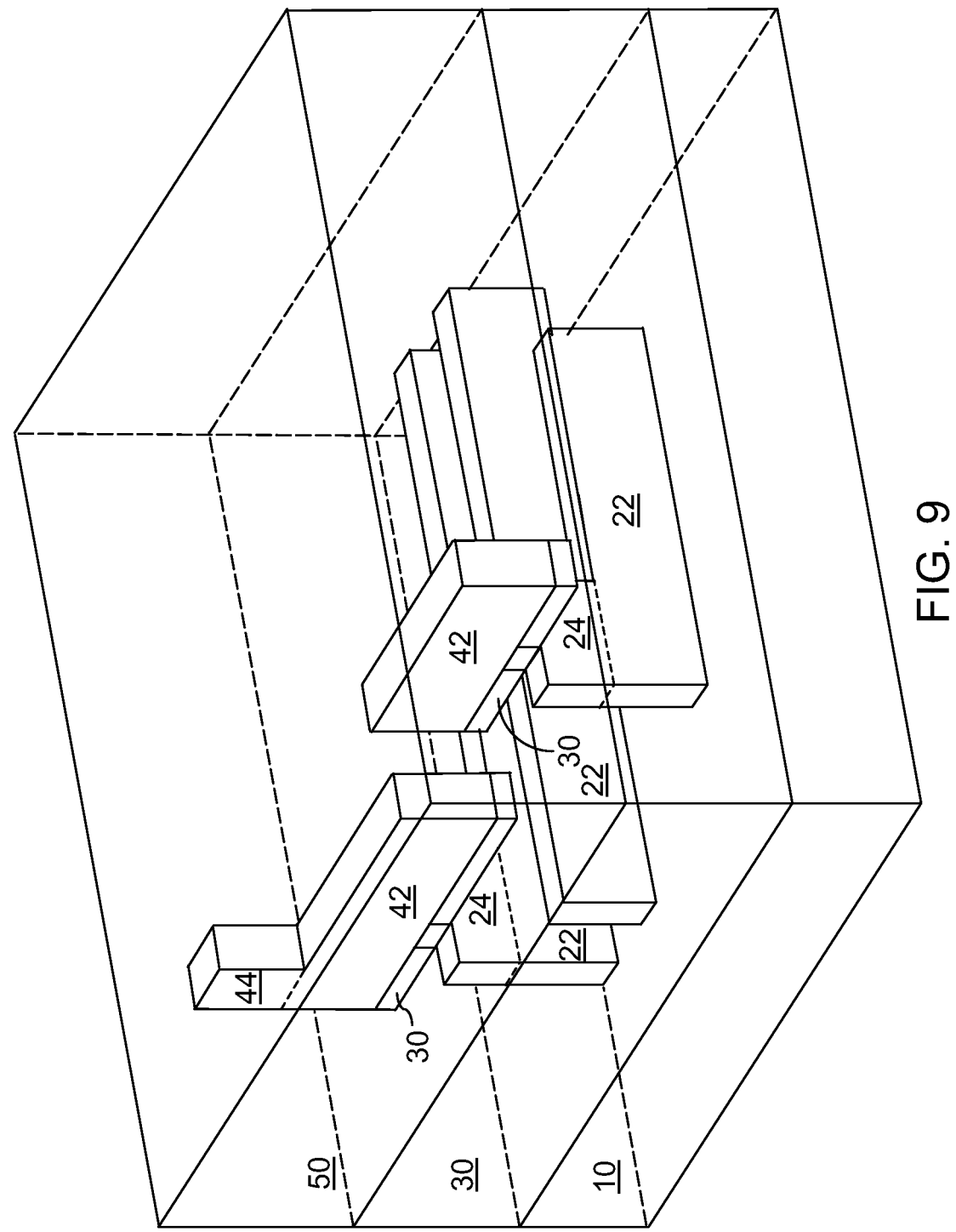
FIG. 9 is a see-through bird's eye view of the exemplary structure of FIG. 8 after formation of a dielectric material layer and planarization according to an embodiment of the present disclosure.

Referring to FIG. 9, a dielectric material layer 50 is deposited over the underlying dielectric material layer 30 and planarized so that topmost surfaces of the at least one metal interconnect structure (44, 42) is coplanar with a planarized top surface of the dielectric material layer 50. The dielectric material layer 50 may include at least one dielectric liner (not shown separately), which can be deposited directly on the surfaces of the underlying dielectric material layer 30 and the metal interconnect structures including the at least one metal interconnect structure (44, 42) and/or at least one metal line 42 without any overlying metal via thereupon.

The material of the dielectric material layer 50 can be selected from any material that can be employed for the underlying dielectric material layer 30, which includes dielectric materials having a dielectric constant of 3.9 or above and low-k dielectric materials having a dielectric constant less than 3.9.

The at least one integrated line and via structure (44, 42) of integral construction is embedded in an upper portion of a dielectric material layer 50. The upper portion of the dielectric material layer 50 herein refers to the portion of the dielectric material layer 50 located above the plane of the interface between the at least one integrated line and via structure (44, 42) and the at least one underlying metal via 24. Each integrated line and via structure (44, 42) includes a metal line 42 having the first substantially constant width and at least one overlying metal via 44 having the first substantially constant width as discussed above. Each of the at least one underlying metal via 24 includes an upper underlying metal via portion 24A and a lower underlying metal via portion 24B. The upper underlying metal via portion 24A vertically contacts an integrated line and via structure (44, 42). The upper underlying metal via portion 24A has a pair of sidewalls laterally spaced by the first substantially constant width, which are the second facing sidewalls 24S (See FIG. 5A). The upper underlying metal via portion 24A is embedded in a lower portion of the dielectric material layer 50. As used herein, the lower portion of the dielectric material layer 50 refers to the portion of the dielectric material layer 50 located below the plane of the interface between the at least one integrated line and via structure (44, 42) and the at least one underlying metal via 24. The dielectric material layer 50 can be a single homogeneous layer or a stack of multiple dielectric material layers having different compositions. Any interface between different materials within the dielectric material layer 50 can be located above or below the horizontal plane of the interface between the at least one integrated line and via structure (44, 42) and the at least one underlying metal via 24. Thus, the upper portion of the dielectric material layer 50 and the lower portion of the dielectric material layer 50 can be of integral construction without an interface therebetween.

Figure 10:
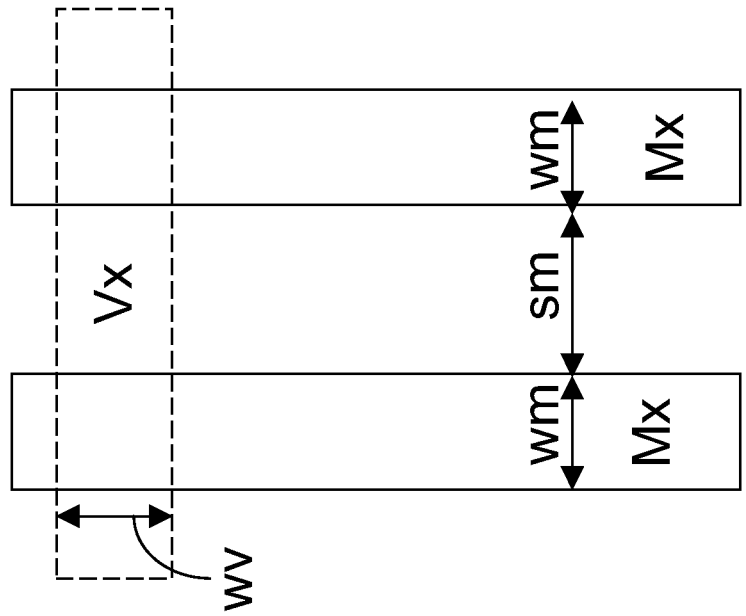
FIG. 10 is a first exemplary layout of Mx level metal lines and Vx level metal vias that illustrate the borderless nature of exemplary integrated line and metal via structures according to an embodiment of the present disclosure.
Figure 11:
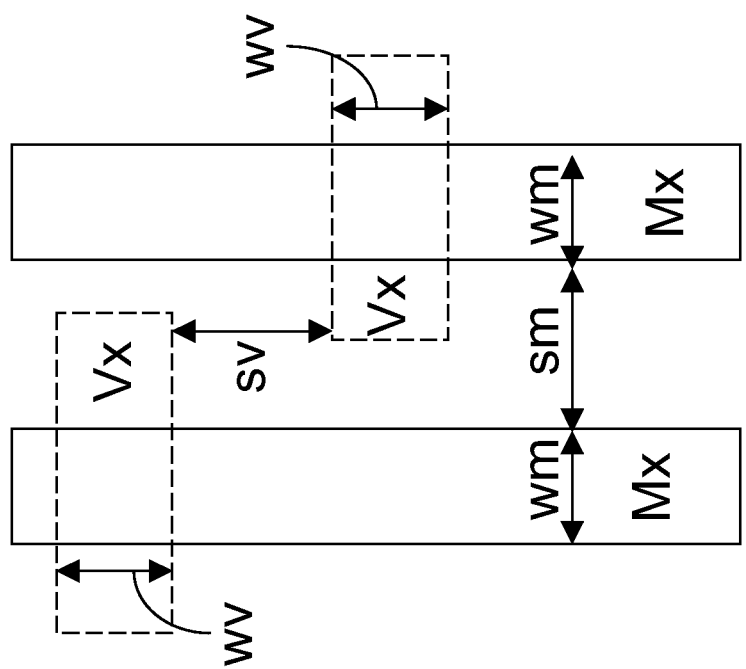
FIG. 11 is a second exemplary layout of Mx level metal lines and Vx level metal vias that illustrate the borderless nature of second exemplary integrated line and metal via structures according to an embodiment of the present disclosure.

Referring to FIGS. 10 and 11, exemplary layouts of Mx level metal lines and Vx level metal vias illustrate the borderless nature of contacts between a metal line and an underlying metal via or between a metal line and an overlying metal via. FIG. 10 is a first exemplary layout, and FIG. 11 is a second exemplary layout.

The metal line can be one of the at least one metal line 42 as shown in FIGS. 7-9, and the underlying metal via can be one of the at least one underlying metal via 24 as shown in FIGS. 7-9, and the overlying metal via can be one of the at least one metal via 44 as shown in FIGS. 7-9. The area of a line-level photoresist defining a metal line is shown as a solid rectangle labeled as Mx. A solid rectangle Mx has a width wm, and is spaced from an adjacent solid rectangle by a line spacing sm. The area of a via-level photoresist defining a metal via is shown as a dotted rectangle labeled as Vx. A dotted rectangle Vx has a width wv, and is spaced from an adjacent dotted rectangle by a via spacing sv.

An illustration is provided herein for a borderless alignment between an underlying metal via 24 and an integrated line and via structure (44, 42) of FIGS. 7-9 or a metal line 42 without an overlying metal via thereupon. An underlying metal via 24 in FIGS. 2-4 is defined by a pattern in a via-level photoresist, which can have a pattern illustrated by the dotted rectangles Vx. The horizontal cross-sectional area of the underlying metal via 24 in FIGS. 2-4 is congruent with the pattern of the via-level photoresist employed to define the area of the underlying metal via 24 in FIGS. 2-4. A metal block 41 of FIGS. 5-6, an integrated line and via structure (44, 42) of FIGS. 7-9, and a metal line 42 without an overlying metal via thereupon of FIGS. 7-9, are defined by a pattern in a line-level photoresist, which can have a pattern illustrated by the solid rectangles Mx. The horizontal cross-sectional areas of the metal block 41 of FIGS. 5-6, the integrated line and via structure (44, 42) of FIGS. 7-9, and the metal line 42 without an overlying metal via thereupon of FIGS. 7-9 are congruent with the pattern of the line-level photoresist, i.e., the first photoresist 47 (See FIG. 4) employed to define the corresponding metal block 41 in FIG. 5.

The area of the at least one upper portion of the underlying metal via 24, i.e., the area of the at least one upper underlying metal via portion 24A within the underlying metal via 24 in FIGS. 5-9, has a shape that is defined by a Boolean "AND" of the pattern of the dotted rectangles Vx and the solid rectangles Mx. Thus, the spacing between an adjacent pair of integrated line and via structures (44, 42), an adjacent pair of metal lines 42 without an overlying metal via thereupon, or an integrated line and via structures (44, 42) and a metal line 42 without an overlying metal via thereupon as illustrated in FIGS. 7-9, is not effectively reduced by the presence of the at least one upper underlying metal via portion 24A, but maintains the ideal value of sm. In other words, the offset in the border of the at least one underlying metal via 24 in the direction facing to the line spacing sm is nullified by the anisotropic etch that removes any portion of the at least one upper underlying metal via portion 24A that would fall outside the areas of the metal lines 42. Thus, the overlay variations between the at least one underlying metal via 24 and the metal lines 42 do not effectively reduce the spacing between adjacent pairs of metal lines 42. Thus, the net effect is as if the at least one underlying metal via portion 24 did not have any border outside the areas of the metal lines 42.

An illustration is also provided herein for a borderless alignment between a metal via 44 and a metal line 42 of FIGS. 7-9. A metal via 44 in FIGS. 7-9 is defined by an intersection of a pattern in a via-level photoresist, i.e., the second photoresist 57 shown in FIGS. 6 and 7, and a pattern in a line-level photoresist, i.e., the first photoresist 47 shown in FIG. 4. The second photoresist 57 can have a pattern illustrated by the dotted rectangles Vx. The first photoresist 47 can have a pattern illustrated by the solid rectangle Mx.

The area of a metal via 44 has a shape that is defined by a Boolean "AND" of the pattern of the dotted rectangles Vx and the solid rectangles Mx. Any extrusion of the Vx pattern outside the areas of the Mx pattern is automatically removed from the area of the metal line 44. Thus, the offset in the second photoresist 57 in the direction facing to the line spacing sm is nullified because a metal block 41 to be etched is not present outside the Mx pattern. Thus, the overlay variations between the second photoresist 57 and the first photoresist 47 do not effectively reduce the spacing between adjacent pairs of metal lines. Thus, the net effect is as if the at least one metal via portion 44 did not have any border outside the areas of the metal lines 42.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of forming a structure comprising:
   forming an underlying metal via embedded in an underlying dielectric material layer on a substrate;
   depositing a metal layer on a top surface of said underlying dielectric material layer;
   patterning said metal layer to form a metal block having a facing pair of sidewalls; and
   etching an upper portion of said underlying metal via within an area that does not underlie said metal block.

2. The method of claim 1, further comprising forming an integrated line and via structure of integral construction by removing an upper portion of said metal block, wherein said integrated line and via structure includes a metal line having a substantially constant width and at least one overlying metal via having said substantially constant width.

3. The method of claim 2, wherein said facing pair of sidewalls is spaced from each other by said substantially constant width.

4. The method of claim 2, wherein a remaining portion of said upper portion of said underlying metal via after said etching forms an upper underlying metal via portion that has a pair of sidewalls laterally spaced by said substantially constant width.

5. The method of claim 2, wherein said substrate includes a semiconductor substrate, and said method further comprises forming at least one semiconductor device on said semiconductor substrate, wherein said integrated line and via structure is electrically connected to said at least one semiconductor device.

6. The method of claim 2, further comprising:
   forming a dielectric material layer after said integrated line and via structure is formed; and planarizing said dielectric material layer, wherein a top surface of said integrated line and via structure is coplanar with a top surface of said dielectric material layer.

7. The method of claim 6, wherein a top surface of a lower underlying metal via portion of said underlying metal via is recessed during said etching of said upper portion of said underlying metal via.

8. The method of claim 7, wherein a horizontal interface between said underlying dielectric material layer and said dielectric material layer is coplanar with said top surface of said lower underlying metal via portion.

9. The method of claim 6, wherein a dielectric material having a dielectric constant less than 3.9 is deposited to form said dielectric material layer.

* * * * *